United States Patent [19]

Tuttle

[11] 3,944,733

[45] Mar. 16, 1976

[54] SIGNAL RECOGNITION APPARATUS

[76] Inventor: Fordyce E. Tuttle, 1017 N. Lake Way, Palm Beach, Fla. 33480

[22] Filed: Feb. 14, 1974

[21] Appl. No.: 442,634

Related U.S. Application Data

[63] Continuation of Ser. No. 216,513, Jan. 10, 1972, which is a continuation of Ser. No. 859,612, Sept. 15, 1969.

[52] U.S. Cl. ............... 178/7.8; 178/7.82; 178/7.87; 178/7.91; 178/DIG. 12; 178/DIG. 34
[51] Int. Cl.² ...................... H01J 1/62; H01J 29/89
[58] Field of Search .......... 178/7.8, 7.82, 7.87, 7.91

[56] References Cited
UNITED STATES PATENTS

| | | | |
|---|---|---|---|
| 2,494,992 | 1/1950 | Ferguson | 250/164 |
| 3,313,940 | 4/1967 | Goodrich | 250/213 |
| 3,397,023 | 8/1968 | Land | 350/160 |
| 3,519,742 | 7/1970 | Bjelland | 178/7.85 |
| 3,592,112 | 7/1969 | Frey | 95/1 R |

Primary Examiner—Robert L. Griffin
Assistant Examiner—Edward L. Coles
Attorney, Agent, or Firm—Malin & Haley

[57] ABSTRACT

An electron - optical - photographic system utilizes the novel qualities of an optical density wedge filter for use with a CRT oscillograph having an optical density along the taper of the wedge equal to the square root of the probability density distribution of a random variable, e.g., "white noise" displayed on one side of the X-axis of the oscillograph. The visual portrayal of the amplitude-time presentation of noise (as on a cathode ray tube) is modified by the filter to produce a uniform gray pattern. Addition of a sinusoidal signal to the noise then results in a clear recognition of the signal even when it is well below the noise level.

1 Claim, 12 Drawing Figures

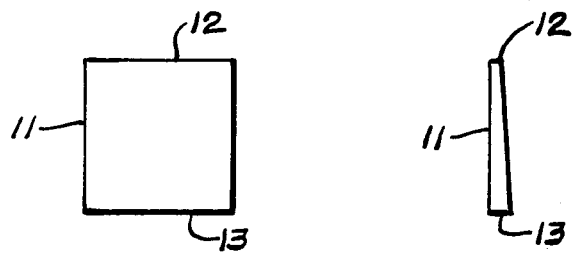
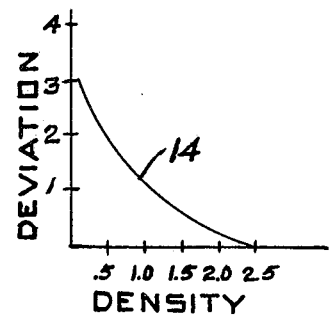
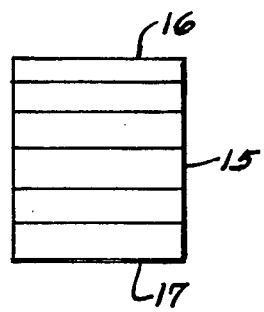
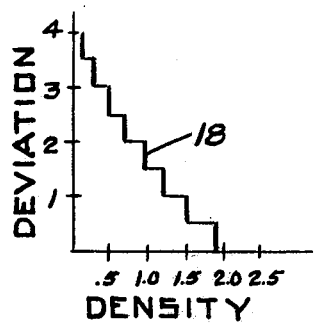
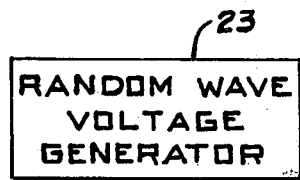
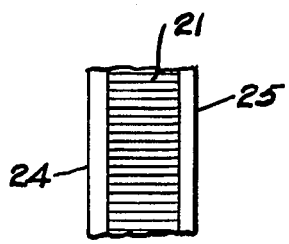
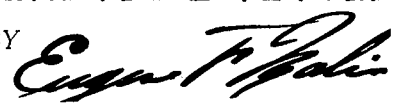
INVENTOR.
FORDYCE E. TUTTLE

INVENTOR.
FORDYCE E. TUTTLE

SIGNAL RECOGNITION APPARATUS

This is a continuation of application Ser. No. 216,513, filed Jan. 10, 1972 which is a continuation of Ser. No. 859,612, filed Sept. 15, 1969.

SUMMARY OF THE INVENTION

The present invention relates to signal recognition apparatus and more particularly to filter means which greatly increases the ability to detect a relatively weak signal, when present, in the presence of high level-wide band noise. For convenience unless otherwise stated the use herein of the terms signal and noise means, respectively, the rms of the signal when present and the rms of the noise.

In attempting to detect a desired signal in incoming radiant energy comprised of the desired signal and unknown noise the general practice has been to "hard clip" and count the number of axis crossings in bearing-time recording. This practice necessarily eliminates information contained in the wave form (signature) of the signal and probably the presence of transients and therefore detection may not be possible except when the transient has an extremely high signal to noise ratio.

For a sine wave signal displayed on a cathode ray tube, there is one writing-versus-time speed for which the wave will be equally bright over its entire cycle. That is, a sine wave having a wave length equal to $2\pi$ times its amplitude as displayed on the face of a CRT oscillograph has a uniform writing speed of the electron beam and is of uniform brightness. A more rapid amplitude with respect to time writing speed will result in the axis-crossings being depressed in brightness relative to the wave crests and troughs, and a slower writing speed will result in the reverse effect. If an extremely high writing speed is employed, the "turn-around" points (the extreme points of the crests and troughs) can be so strongly emphasized relative to the other portions of the waves that only they contribute significantly to the pattern brightness. One way of accomplishing this is to compress the wave length on the tube face so that $dx/dt$ approaches zero and then only the turn-arounds will be visible, i.e., both $dy/dt$ and the writing speed are near zero.

Because the amplitude excursions of noise are random (they possess a certain probability distribution), the use of the turn-around accentuation process just described leads, when a long sample of noise is displayed on a cathode ray tube, to a varying brightness pattern. Because, for the noise case, small excursions occur more frequently than large, the accentuation of their turn-around points will cause the CRT display to be much brighter near the axis than in areas more distant from the axis.

The present invention introduces the concept of a shaded mask or filter made quite opaque near the axis and less opaque as the distance from the axis increases. The variation in opacity is chosen such that when the mask (filter) is placed in front of the CRT display, the noise pattern above described is changed from one being much brighter near the axis to one which is uniformly bright over the entire range of signal valves, i.e., a uniform gray pattern results. Thus the filter (mask) of the present invention may be defined as an optical wedge of variable density transparency where the optical density along the taper of the wedge is equal to the square root of the probability density distribution of a random variable.

If the random noise signal which is generating the uniform pattern is disturbed by the addition of a non-random signal, the filter no longer appears a uniform gray. This may be explained by considering that the original noise signal is riding "on top" of the non-random signal which causes the noise pattern to move up and down in synhcronism therewith. A sinusoidal signal accordingly transforms the uniform gray pattern into one having striations whose spacing corresponds to the period of the sine-wave signal. The presence of, as well as the frequency of a repetitive signal is thus revealed even though it was deeply embedded in the noise. Further enhancement in signal detection is possible if the frequency of the signal to be detected is known or discovered; then the sweep repetition rate can be adjusted to this frequency or a sub-multiple thereof and a photograph made of numerous repeated sweeps.

The objects of the present invention include the efficient visual portrayal of a signal generated in a phosphor layer in the presence of high level noise, effectively hard clipping at all possible levels and cross correlating signal data from all levels, the providing of novel filter means which effect spectacular improvements in results obtainable with existing signal processing equipment, and the capability of detecting low-level transients.

Other objects and advantages of the invention will become apparent from the following description when read in connection with the accompanying drawing and its scope will be pointed out in the appended claims.

BRIEF DESCRIPTION OF THE DRAWINGS

In the drawing:

FIGS. 1 and 2 are front and side elevations, respectively, of a preferred embodiment of the filter of the invention;

FIG. 3 is a graph illustrating the optical characteristics of the embodiment shown in FIGS. 1 and 2;

FIGS. 4 and 5 are front and side views, respectively, of another filter construction embodying the invention;

FIG. 6 is a graph illustrating the optical characteristics of the filter construction shown in FIGS. 3 and 3A;

FIG. 7 is a schematic view of an arrangement for producing in situ on a CRT a filter incorporating the invention;

FIG. 8 is a fragmentary cross section of the face of the CRT of FIG. 7 showing its fiber optics construction;

DESCRIPTION OF THE PREFERRED EMBODIMENT

Figure 9:
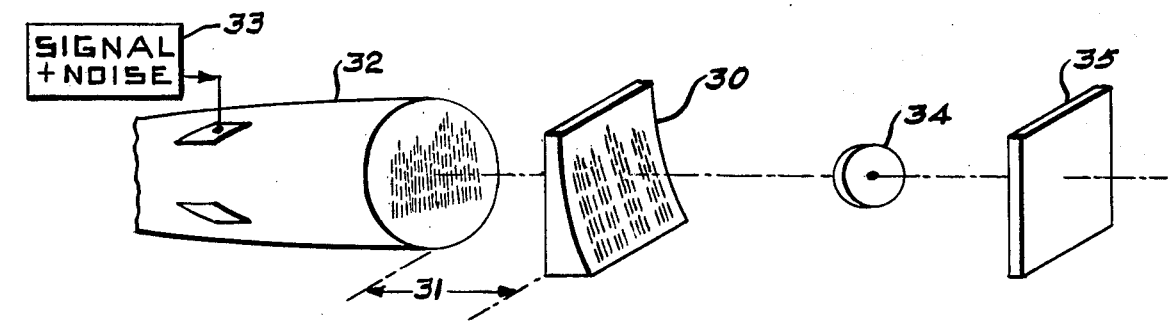
FIG. 9 is a diagrammatic view in perspective showing one system incorporating the invention.

Because discussions of the statistical theory of random distribution use the Greek letter ($\sigma$) for specifying the standard deviation of random variables, the filter and the procedure described above are frequently referred to as a sigma filter and a sigma process, respectively. Thus the proper variation in opacity of the filter is obtained by plotting density against $\sigma$ (standard deivation) and such a filter, if non-scattering, may be placed on the face of a CRT oscillograph display with its butt edge on the X-axis of the display and its thin edge at a 3 σ level of random noise display which level in practice is obtained by adjusting the amplitude of the Y-axis excursions. If the filter is light scattering, as would be the case if formed in a silver halide emulsion, then it is positioned in an image of the tube display either by conventional objective lenses or by providing the tube with a fiber-optic face plate upon the back of which the phosphor is deposited whereby any image formed in the phosphor is moved to the front of the fiber-optic plate. This latter structure makes it very convenient to form a sigma filter in situ simply by coating the fiber optic face with a photographic emulsion, exposing the emulsion to a random noise display and thereafter developing the exposed emulsion to a negative at gamma unity. It may be well to note that the 3 σ level is a somewhat arbitrary choice but seems reasonable because only approximately one in a thousand excursions of random noise exceed that amplitude, i.e. 0.1 percent.

In FIGS. 1 and 2 there are shown two views of an optical density wedge 11 which tapers along its vertical dimension in a non-linear manner such that its density increases from its thin edge 12 to its thick or butt edge 13 as a direct function of the square root of the probability density distribution of a random variable which is shown in graph form in FIG. 3. As was pointed out above the curve 14 of the graph is not plotted above the 3σ level because no more than 0.1 percent of a random variable exceeds this level.

FIGS. 4 and 5 show a density wedge 15 having effectively the optical properties of the filter shown in FIGS. 1 and 2 and differs therefrom in that its density increases from its thin edge 16 to its butt edge 17 in a series of steps, here shown as seven, as presented in graph form in FIG. 6 in which the center of the several rises of the steps lie on and define a curve corresponding to the curve 14 in FIG. 3.

The filters 11 and 15 are preferably cast in a suitably shaped mold using gelatine having dispersed therein finely divided lampblack which does not scatter light. One reason for the step filter 15 being illustrated is that it may readily be constructed from strips of commercially available neutral density filter sheets and thus avoid the cost of tooling for quantity production of cast filters. The filters may of course be made of other materials which may contain a dye of a color which is substantially complementary to the color of the fluorescent radiation of the oscillograph with which it is to be utilized. Also, a performed 'wedge' container may be filled with a silicone grease, e.g. Dow-Corning-7 compound, dyed so that its transparency varies with thickness; one suitable dye being Cyanamide Calco Nigrosine Base. Transparency varies from 90 to 10 percent as the thickness of the grease varies from 0.0001 to 0.001 inch. Another and quite convenient way of making a filter according to the invention is a photographic one which may be practiced in several ways; one of which is to make a print of a filter onto a suitable photographic film or plate and another way is to expose a light sensitive emulsion directly to an image of an oscillograph display of random noise. In each procedure the exposed emulsion is developed to gamma unity.

FIG. 7 shows a CRT oscillograph 20 provided with a fiber-optic face plate 21 and having its horizontal and vertical deflection means connected, respectively, to an X-sweep circuit 22 and to a uniform power spectrum random noise generator 23. As shown in FIG. 8 the fiber-optic face plate 21 has a phosphor coating 24 on its black surface and has a photographic emulsion layer 25 on its front face. After exposure to the random noise display the emulsion layer is developed, in situ, to a negative at gamma unity to provide a filter according to the invention. It is to be understood that the generator 23 (or circuits not shown) is adjusted so that the X-axis is positioned at the bottom of the plate 21 and so that the top of the Y-deflection is at the 3 level.

Figure 10:
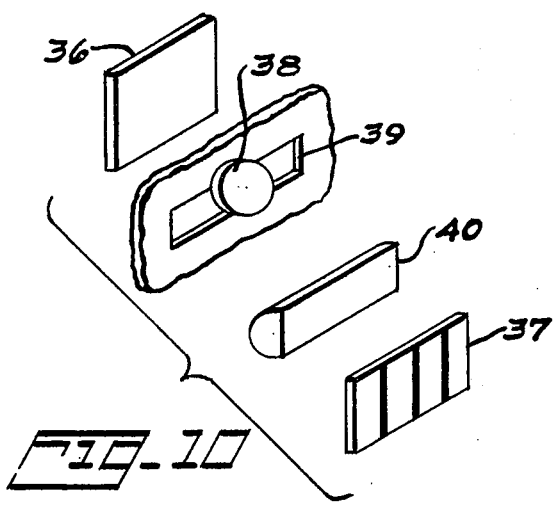
FIG. 10 illustrates further processing of the output of the arrangement shown in FIG. 9.

FIG. 9 in a partly exploded view shows a sigma filter 30 in contact (as indicated by numeral 31) with the face of a CRT oscillograph 32 which has been adjusted to place the top of its Y-deflection at the 3 level when energized from a signal-plus-noise source 33 and to place its X-axis, the 0 level, near the bottom of the face of the tube 32. The face of the tube below the X-axis is masked off as with black tape. The filter is photographed, preferably at one-to-one magnification, via a lens 34 on a film 35 which is then developed to gamma unity. A positive print 36 (FIG. 10) of the negative film 35 is made from which a plurality of transverse strips or zones may be overprinted on a film strip which is then processed to a high gamma, or, as is preferred and as shown in FIG. 10, the positive film 36 is printed onto a film strip 37 through a collimating lens 38 provided with a slot diaphragm 39, and a cylindrical lens 40 arranged with its axis perpendicular to the taper of the filter image on the film 36 thus effectively overprinting on the film 37 all of the transverse strips or zones of the filter image on the film 36. The film 37 is developed to a high gamma and will show striations indicated on the filter 30 in FIG. 9. Referring again to FIG. 9 the display on the face of the oscillograph 32 showing high level noise mixed with a low level repetitive signal and wherein it is indicated that the repetitive signal is only slightly apparent at the top of the display whereas when the filter 30 is in place as shown, the striations become apparent throughout the height of the filter i.e. as explained above the signal adds to all of the noise excursions above the X-axis.

Figure 11:
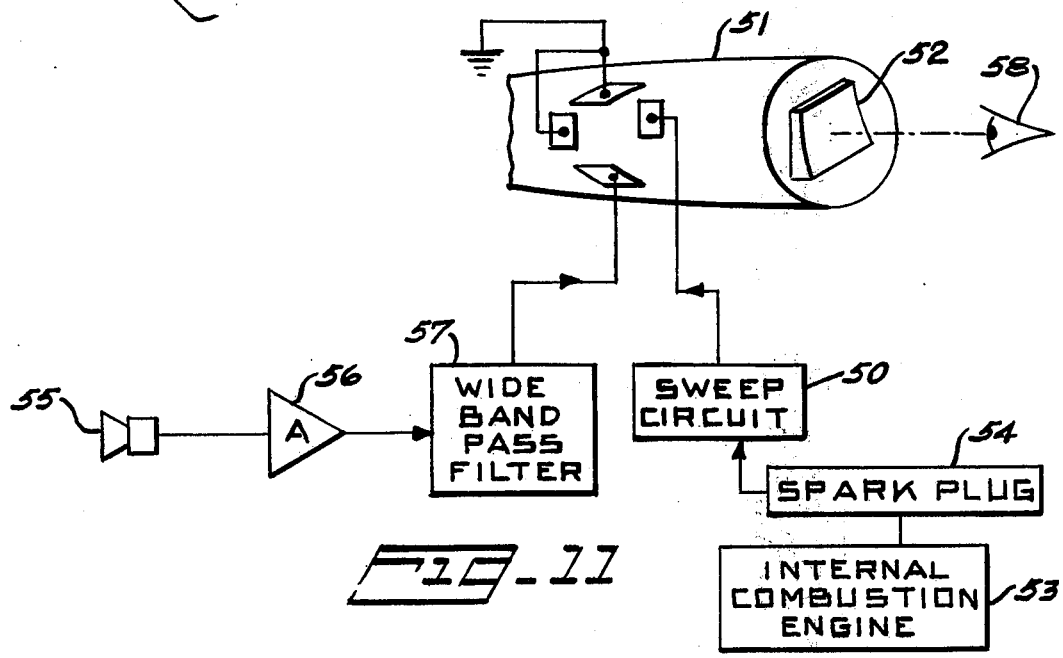
FIG. 11 is a schematic diagram illustrating the use of the invention as an internal combustion engine analyzer.

FIG. 11 indicates a use of the invention in connection with the analyzing of the operation of an internal combustion engine. As herein shown a sweep circuit 50 for a CRT oscillograph 51 on which a sigma filter 52 is mounted, is initiated by a selected portion of an internal combustion engine 53 and here shown as a spark plug 54. A microphone 55 positioned to pick up sound from the engine 53 provides a corresponding electrical signal which is passed through an amplifier 56 and a wide band pass filter 57 to the vertical deflection plate of the tube 51. Signals such as might result from repetitive piston slap in a single cylinder of a multiple cylinder engine are weak relative to random noise and probably could not be resolved by electronic hard clipping alone. However using the system of the present invention the display as viewed by an observer 58 essentially hard clips at all possible levels and permits the eye to observe transients due to unwanted clicks or slaps, etc. and with knowledge of the sequence of operation of the different parts of the engine 53, the observer can identify the source of the undesirable transient.

Figure 12:
FIG. 12 is a side view of a filter having two tapered wedges joined butt to butt.

FIG. 12 shows a filter 60 having a double taper to that when desired, both the positive and negative portions of a signal may be observed e.g., an implosion has the stronger part of its signal opposite to the stronger part of a signal wave caused by an explosion.

If as was discussed above the tube display is compressed so that $dx/dt$ approaches zero i.e., there is no X-axis sweep, then a high gamma film can be moved in the X-direction on the face of the sigma filter, or in an image thereof, to record the display in two-dimensional form for visual inspection which greatly enhances recognition and/or interpretation because the signal repetition rate is readily visible to the eye. This enhancement reuslts from the fact that the S/N (signal to noise) ratio of any low frequency signal in the presence of wide band noise will profit by the benefit effected by a multiplicity of mathematically independent observations because on every occasion that the rate of change of the signal is equal and opposite to the instantaneous rate of change of noise, $ds/dt$ will be equal and opposite to $dN/dt$ and the writing speed of signal plus noise is zero and is recordable as just explained.

A very useful arrangement which directly provides an observer with a suitable display i.e., no photographic step need be involved, is to provide the CRT oscillograph 32 of FIG. 9 with a memory phosphor and so adjusted as to provide high constrast. The display is presented on substantially the entire face of the tube 32 with a single sweep along the X-axis at a sweep rate adjusted to obtain a sharp edge (edge effect) to the signal display. That is to say that $dx/dt$ is very small compared to $dy/dt$ and after some practice adjusting the X-scan rate an operator becomes adept at producing a very satisfactory display which preferably is rendered more legible by condensing the display vertically, as by a cylindrical lens such as the lens 40 in FIG. 10, to match the recognition ability of the human eye.

It will be evident from the foregoing that the present invention represents an enormous advance in the art of signal recognition in the presence of high level noise. It may be well to mention that the sigma filter of the invention is in practice much thinner than the apparent thickness of those illustrated in the drawing although, of course, the filters can be of any desired dimensions as long as they comply with the optical requirements herein set forth.

While for the purpose of disclosing the invention to enable those skilled in the art to practice the same only a few preferred embodiments have been described in detail, it will be obvious that the novel features may be incorporated in a variety of embodiments without departing from the scope of the invention pointed out in the appended claims.

What is claimed is:

1. The method of optically enhancing signal recognition in the presence of noise in a visual display on a cathode ray oscillograph which comprises the steps of:

generating a visual display in a high contrast memory phosphor by a single sweep along the X-axis of said oscillograph at a sweep rate which is very small compared to the real time change in the amplitude of a signal; and modifying the light combining from the visual display such that the entire visual display appears uniformly bright when random noise alone is represented by the said display, whereby optical hard clipping of a non-random signal occurs at all levels.

* * * * *